June 7, 1966 WOO F. CHOW 3,255,361

TRANSFORMER TRIGGER TUNNEL DIODE NOR LOGIC CIRCUIT

Filed Nov. 29, 1962

INVENTOR
WOO F. CHOW

BY G. Donald Weber, Jr.

AGENT

United States Patent Office 3,255,361

Patented June 7, 1966

3,255,361

TRANSFORMER TRIGGER TUNNEL DIODE NOR LOGIC CIRCUIT

Woo F. Chow, Horsham Township, Montgomery County, Pa., assignor to Sperry Rand Corporation, New York, N.Y., a corporation of Delaware Filed Nov. 29, 1962, Ser. No. 240,867

6 Claims. (Cl. 307—88.5)

Figure 1:
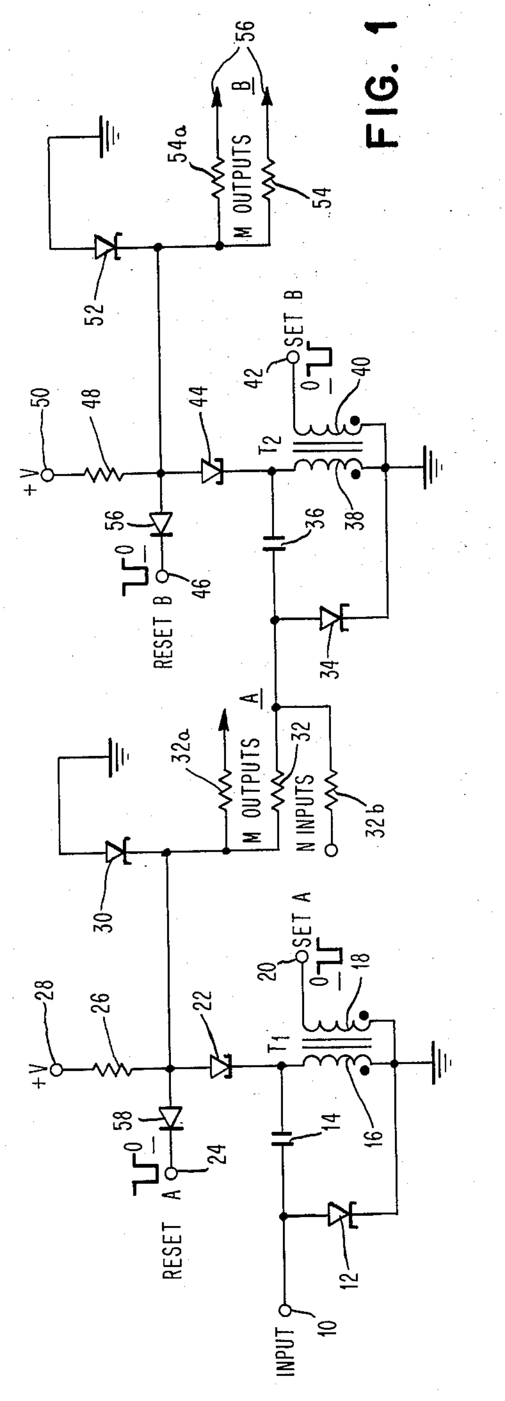

This invention relates to a logic circuit. More particularly, the invention relates to a logic circuit which is capable of performing the NOR logic function.

It is well known in the electronic industry that many devices require electronic logic circuits. That is, many of the electronic devices presently being produced, for example electronic data processing machines, require iterative circuits. These iterative circuits form the basic building blocks of the overall system circuitry. In addition, the building block circuits often perform one of the logic functions. Many logic functions have been defined and many circuits have been produced which will perform these logic functions. A particular logic function, namely the NOR logic function, has been defined as the combination of two other logic functions, namely the NOT and OR functions. A circuit which performs the NOR logic function is of course advantageous, as well as practical, inasmuch as two logic functions are performed by a single circuit. The performance of two logic functions by a single circuit is of course highly desirable inasmuch as the expense of the machine is reduced because of the reduction in the required hardware. The overall bulk of the machine is also reduced. Each of these reduction factors is important both from a technical standpoint and the marketing standpoint.

In order to perform the NOR logic function, several circuits have been proposed. These circuits are all somewhat different and unique in their configuration and operation. The distinctions between the circuits make each of the circuits useful and desirable under different operating conditions. The NOR circuit described herein uses a tunnel diode as the switching elements. A switching signal is applied to the tunnel diode via a coupling transformer. The control of the application of the switching signal by the transformer coupling circuit is achieved by the use of backward diodes which are connected to the tunnel diode. Thus, depending upon an input condition, one of the backward diodes may be forward biased or reverse biased. The operating condition of the backward diode effects different load conditions on the transformer and, thereby, controls the current flow through the windings of the transformer coupling circuits through which the switching signal is applied to the tunnel diode. In one condition of the backward diode, the switching signal will be applied to the tunnel diode thereby altering the operating condition thereof. In the other condition of the backward diode, the switching signal will be ineffective with respect to altering the operating condition of the tunnel diode. Another backward diode connected at the output electrode of the tunnel diode provides a current path through which current may be applied to a tunnel diode when it is being switched from one condition to the other. In addition, a biasing network is connected to the tunnel diode whereby the tunnel diode operates in the bistable mode. The operational characteristics of tunnel diodes and backward diodes are down in the art.

From this brief description, it will be seen that one object of this invention is to provide a logic circuit having relatively few components.

Another object of this invention is to provide a high speed switching circuit using tunnel diodes.

Another object of this invention is to develop a high speed switching circuit using tunnel diodes and performing the NOR logic function.

Another object of this invention is to provide a NOR logic circuit using tunnel diodes and having a broad tolerance limit on the components and supplies.

Another object of this invention is to provide a logic circuit having resistor coupled inputs and outputs.

Another object of this invention is to provide a NOR logic circuit which is relatively inexpensive to produce.

Figure 2:
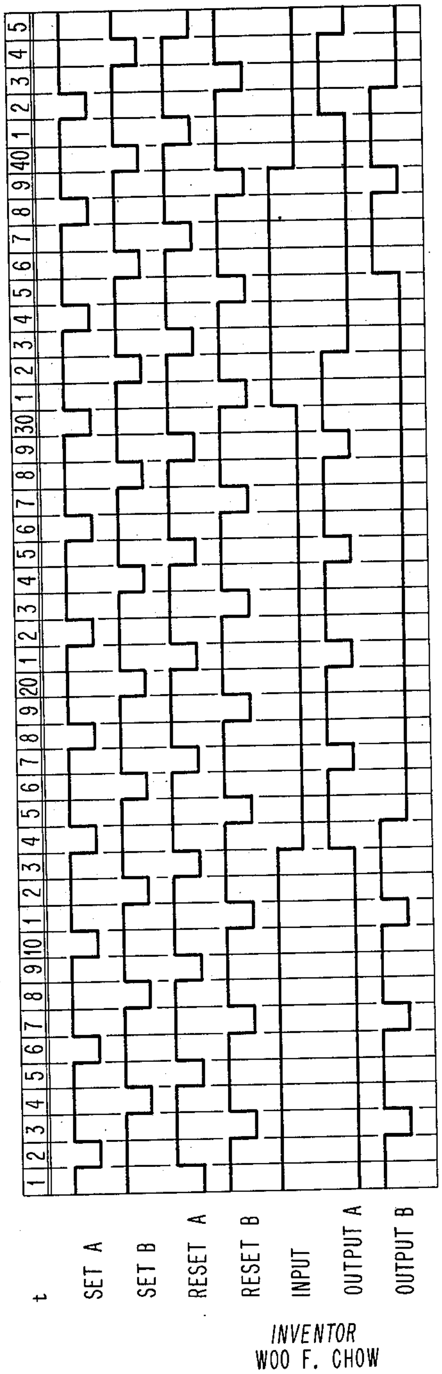

These and other objects and advantages of this invention will become more readily apparent while reading the following description of this circuit in conjunction with the attached drawings, in which:

FIGURE 1 is a schematic diagram of a cascaded pair of circuits, each of which represents the instant invention; and FIGURE 2 is a timing diagram for the cascaded pair of circuits shown in FIGURE 1.

Referring now to FIGURE 1, there is shown a cascaded pair of circuits. It will be seen that each of these circuits is substantially similar. It is to be understood that each of these circuits is capable of performing the NOR logic function and, therefore, is the circuit which represents the instant invention. However, in order to suggest a possible utilization of the circuit, a pair of the circuits have been cascaded to form a sub-system which may be considered as a shifting register, or the like. In the sub-system shown, input source or input terminal 10 is representative of any type of input source which is capable of supplying either pulse or level type signals. Since the circuit is capable of operating in response to pulse or level type of signals, the type input supplying source is not severely limited. The input source 10 is connected to the anode of backward diode 12. The cathode of backward diode 12 is connected to a suitable reference potential, for example, ground potential. Backward diode 12 may typically be an RCA type 1N3863 germanium backward diode. Thus, a backward diode will provide a low impedance path to current flow in one direction and a high impedance path to current flow in the opposite direction. More particularly, the low impedance characteristic is provided when the backward diode is effectively forward biased and the high impedance characteristic is exhibited when the backward diode is reverse biased. Connected to the anode of backward diode 12 is one terminal of capacitor 14. Another terminal of capacitor 14 is connected to one terminal of winding 16 of transformer T1. Capacitor 14 may typically be about 25 picofarads. Another terminal of winding 16 is connected to ground. Transformer T1, which may typically be a step-down transformer having a turns ratio of 1:2 such that current amplification will take place therein in response to the application of a signal to the primary winding thereof. The other winding of transformer T1 has one terminal thereof connected to ground. Another terminal of winding 18 of transformer T1 is connected to source 20. Source 20 is designated as the Set A source. That is, the first circuit in the cascaded pair is considered as a phase A circuit for identification purposes. Therefore, the Set A signal is applied thereto. Source 20 may be any type of conventional source capable of supplying a pulse when desired. The pulses may be periodic and regularly recurring (see FIGURE 2) but are not so limited. In the preferred embodiment, the Set A signal has a base-line potential value of about 0 volts and the relatively negative going pulse has a magnitude of about 1 volt. Thus there is provided a set signal having a magnitude of 1 volt.

The tunnel diode 22 has the cathode thereof connected to winding 16 and capacitor 14 at the common junction thereof. The anode of the tunnel diode is connected to the Reset A source 24 via diode 58. Diode 58 is connected such that source 24 is normally isolated from tunnel diode 22. Thus, in the preferred embodiment, the cathode of diode 58 is connected to source 24 and the anode of diode 58 is connected to the anode of tunnel diode 22. Therefore, a negative going Reset A signal will be transferred to tunnel diode 22 but source 24 is otherwise isolated. Particularly, the tunnel diode 22 may be an RCA 1N3853 type tunnel diode which has a peak current value of about 10 milliamperes. The Reset A source may be a conventional source similar to source 20 which is capable of supplying pulses when desired. In a preferred embodiment, source 24 applies a periodic regularly recurring signal having a base-line magnitude of about 0 volts and a signal magnitude of about 1 volt. Thus, the relatively negative going Reset A signal has a magnitude of about 1 volt. Connected to the anode of tunnel diode 22 is one terminal of resistor 26 which may be on the order of 1000 ohms. Another terminal of resistor 26 is connected to source 28, which may be any conventional type of source capable of supplying a substantially constant potential of about +8 volts. The circuit combination of source 28 and resistor 26 functions as a substantially constant current source which supplies about 8 milliamperes and thereby biases the tunnel diode such that it operates in the bistable mode.

Also connected to the anode of tunnel diode 22 is the cathode of backward diode 30. The anode of backward diode 30 is connected to ground. Backward diode 30, which is similar to backward diode 12 provides a low-impedance current-path in series with tunnel diode 22 as will appear subsequently. The output from the circuit is derived from the anode of tunnel diode 22. Thus, the M outputs which are derivable from the circuit are represented by resistors 32 and 32*a*. These resistors, which may be on the order of 200 ohms, are connected to the output device which, in the embodiment shown, is a circuit substantially similar to the previously described circuit. The N inputs to a circuit such as that described are represented by the resistors 32 and 32*b*. The input coupling resistor is, in fact, the output resistor of the preceding circuit.

The input terminal (one terminal of output resistor 32) is connected to the anode of backward diode 34. The cathode of backward diode 34, which is similar to backward diode 12, is connected to ground. The anode of backward diode 34 is also connected to one terminal of capacitor 36 which has a rating of about 25 picofarads. Another terminal of capacitor 36 is connected to the secondary winding 38 of transformer T2. The secondary winding 38 and the primary winding 40 of the transformer each have one terminal thereof connected to ground. The Set B signal source 42 which is similar to the Set A source 20 except for the timing relationships is connected to another terminal of winding 40. Tunnel diode 44, similar to tunnel diode 22, is connected to winding 38 of transformer T2. The anode of diode 56 is connected to the anode of tunnel diode 44. The cathode of diode 56 is connected to Reset B source 46. Source 46 is similar to source 24 except for the timing relationships.

Again, a substantially constant current source is provided for the tunnel diode. This constant current source comprises potential source 50 capable of supplying approximately +8 volts and resistor 48 which is about 1000 ohms. The backward diode 52, similar to backward diode 30, has the anode thereof connected to ground and the cathode thereof connected to the anode of tunnel diode 44. The M outputs which are derivable from the circuit are represented by the resistors 54 and 54*a*, which are about 200 ohms, and each of which has one terminal connected to the anode of tunnel diode 44. The other terminals of resistors 54 and 54*a* represent the output terminals 56. These output terminals are connected to any type of output utilization device which may be desirable.

The precise components and component values suggested and specified are not meant to be limitative of the invention. Rather, these suggestions and specifications are made in order to present a preferred embodiment of the invention. Minor variations in the circuitry are contemplated and these variations are meant to be included within the scope of this invention provided the principles to be described infra are incorporated.

The operation of the circuit shown in FIGURE 1 will be more readily apparent when described in conjunction with the timing diagram shown in FIGURE 2. Therefore, reference is made to FIGURES 1 and 2 concurrently for the description of the operation of the circuit. The input signal shown in FIGURE 2 is an arbitrarily defined signal. That is, the high or low level signal and the time of switching from one level to another level are merely arbitrary and are not meant to limit the operation of the circuit described. Initially, the input is designated as a high level signal and continues as such from time period T1 through time period T13.

When the signal applied to input 10 is a high level signal, backward diode 12 is in the high conduction region. That is, because of the V–I characteristics of a backward diode, a relatively high current passes through the diode when it is forward biased. Thus, the backward diode 12 appears as a low impedance component. Clearly, the low impedance of backward diode 12 is connected across the winding 16 of transformer T1. Consequently, when a Set A signal is applied by source 20 to transformer T1 via winding 18, the low impedance shunt of backward diode 12 effectively short circuits the winding 16. Thus, tunnel diode 22 remains in the initial operating condition, or low voltage condition, because of the Reset A signal applied by source 24 at time period T1. Therefore, output A (the output of the first stage of the sub-system) remains a low level signal inasmuch as the output signal is detected at the anode of tunnel diode 22. Similarly, in view of the high level input signal, the Set A signals at time periods T2, T6 and T10 are ineffective to cause any change in the output produced by tunnel diode 22. Since no change is made in the operating condition of tunnel diode 22, the Reset A signals at time periods T1, T5 and T9, in effect, cause no change to be made to the circuit.

At time period T14, the input signal shifts to a low level signal. This signal remains a low level signal until time period T30. When the input signal becomes a low level signal, backward diode 12 is effectively zero biased. Thus, because of the V–I characteristics, backward diode 12 is in the low conduction region and presents a relatively high impedance across winding 16. In this condition, the application of the Set A signal by source 20 via winding 18 is effective to induce a current signal in winding 16 of transformer T1. This current signal applied in winding 16 is of such a polarity that current flows through tunnel diode 22 to winding 16 and, thus, to ground. Reset A source 24 is isolated by the proper connection of diode 58 such that current cannot be drawn from the source 24 at the time when a signal is applied by source 20. That is, because of the relative polarity of the signals applied at the electrodes thereof, diode 58 is reverse biased. Furthermore, the substantially constant current source comprising source 28 and resistor 26 are also ineffective to permit the application of further current to tunnel diode 22. The only remaining circuit paths through which current may be supplied are via backward diode 30 or coupling resistor 32. However, since backward diode 30 is forward biased in this condition, it is in the low impedance, high conduction region. Backward diode 30 provides a circuit path having a lower impedance than the coupling resistor whereby a relatively large current flow through the diode is possible. Therefore, when the current signal through winding 16 tends to cause current to flow through tunnel diode 22, the additional current is supplied via the circuit path comprising backward diode 30. This additional current is effective to switch tunnel diode 22 to the high voltage operating condition whereby high level output signals are obtained.

Thus, for example, the Set A signal at time period T14, in conjunction with a low level input signal from source 10, will cause an induced current signal to be produced in winding 16. This current signal is of such a polarity that current will be drawn from ground via backward diode 30 and tunnel diode 22 such that the tunnel diode is switched into the high voltage operating condition. The output signal detected at the anode of tunnel diode 22 thus switches from a low level to a high level signal. Furthermore, this condition continues until the tunnel diode is reset to the low voltage operating condition at time period T17. At time period T17, the output signal (at the anode of tunnel diode 22) switches to the low level.

At time periods T18, T22, T26 and T30 the Set A signal is applied by source 20. Since the input signal supplied by source 10 at these times is a low level signal, backward diode 12 is biased in the high-impedance, low-conduction state. Thus, a current signal may be induced in winding 16 of transformer T1 by a signal in winding 18 at these time periods. The current signals thus produced are each effective to cause current flow from ground via backward diode 30 and through tunnel diode 22. This current flow through tunnel diode 22 is of such magnitude and polarity to cause the tunnel diode to be switched to its high voltage operating condition. The tunnel diode continues to operate in this condition, thereby providing a high level output signal, until a Reset A signal is supplied. Reset A signals are supplied at time periods T21, T25, T29 and T33. These reset signals are of such polarity and such magnitude that tunnel diode 22 is reset to the low voltage operating condition.

It will be seen that the circuit produces an output signal which is substantially pulse-like. This pulse-like signal may be utilized with a succeeding circuit such that the reset operation is unimportant. That is, the succeeding circuit may be sampled, or switched, or the like, at some time different from the resetting time of the first circuit. This operation is readily apparent and would usually be desirable in most utilizations of the circuit. In any event, different phases of control signals are usually applied to sub-systems of the type shown. Modifications may be made to the circuitry whereby well known techniques are used for effectively smoothing the output signal produced by the circuit.

At time period T31, the input signal supplied by source 10 switches to the high level again and remains such until time period T39. The high level input signal effectively forward biases backward diode 12 such that diode 12 exhibits a low-impedance high-conduction characteristic. With this operating characteristic the backward diode acts as a shunt load across the transformer winding 16. Consequently, as suggested supra, the application of a Set A signal by source 20 has no effect on the tunnel diode 22. That is, at time periods T34 and T38 no effective current signal is applied to tunnel diode 22, whereby the output signal at the anode of tunnel diode 22 remains a low level signal. The tunnel diode 22 was reset to the low voltage operating condition by a Reset A signal from source 24 at time period T33 and is not switched therefrom by a Set A signal until time period T42 as will appear subsequently. The operation of the circuit during time periods T31 through T39 is similar to the circuit operation during time periods T1 through T13 when the input signal supplied by source 10 was also high.

Again, at time period T40 the input signal supplied by source 10 becomes a low level signal and remains such for the remainder of this description. This low level input signal effectively zero biases backward diode 12 whereby the diode exhibits the low conduction, high-impedance characteristic. The operation from time periods T40 through T45 is similar to that operation obtained between time periods T14 and T30. Thus, the application of a Set A signal by source 20 at time period T42 produces an induced current signal in winding 16 and, thereby a change in the operating condition of tunnel diode 22. The change in the tunnel diode causes the output signal at the anode thereof to switch to a high level signal. This high level signal continues until tunnel diode 22 is reset to the low-voltage operating condition by a signal from Reset A source 24 at time period T45.

It should be clear, therefore, that the circuit operates to produce an output signal only in the absence of any input signal and vice-versa.

In the embodiment shown, a second logic circuit is connected in cascade with the circuit already discussed. The operation of the cascaded circuit is identical to the operation of the first circuit. The cascaded sub-system is utilized to show input and output operating features of the individual logic circuits. Again referring to FIGURES 1 and 2 concurrently, the operation of the cascaded, or phase B, circuit is described. Thus, during time periods T1 through T13 the output signal produced by the phase A circuit, at the anode of tunnel diode 22 and transferred via coupling resistor 32, is a low level signal. That is, tunnel diode 22 is in the low voltage operating condition. Consequently, backward diode 34 is effectively zero biased by the relative potentials at the anode and cathode thereof. Backward diode 34 thereby presents a high-impedance, low-conductance path across the secondary winding 38 of transformer T2. Therefore, when Set B signals are supplied to winding 40 by source 42 at time periods T4, T8 and T12, a current signal is induced in winding 38. This current signal is drawn through tunnel diode 44 from ground via backward diode 52. The suggested current path is provided inasmuch as isolating diode 56 is reverse biased and will not pass current therethrough (in an ideal case) and the combination of source 50 and resistor 48 provides a substantially constant current signal.

As tunnel diode 44 is switched to the high voltage operating condition by the application of the current signal in the transformer winding, the output signal at the anode thereof becomes a high level signal. This high level output signal is transferred to output terminals or devices 56 by coupling resistors 54 and 54*a*. Clearly, tunnel diode 44 is reset to the low voltage operating condition by the application of Reset B signals by source 46 at time periods T3, T7, T11 and T15.

At the subsequent Set B signals at time periods T16, T20, T24, T28 and T32, the input signals supplied to the phase B circuit by tunnel diode 22 are high level signals. Thus, by proper timing, it is seen that the pulse-type output signals produced by tunnel diode 22 function as a level-type signal. These high level input signals function to forward bias backward diode 34 such that this diode exhibits its low-impedance, high-conductance operating characteristic. In this operating condition, backward diode 34 functions as a short-circuit shunt across winding 38 of transformer T2. Consequently the aforementioned Set B signals are effectively shunted. For this reason, tunnel diode 44 remains in the low-voltage operating condition where it was biased after the Reset B signal at time period T15.

Tunnel diode 44 continues to produce the low level output signal until time period T36. At this time, the tunnel diode is switched into the high voltage operating condition whereby a high level output signal is produced. The high level output signal is produced in response to the coincident occurrence of a Set B signal and a low level input signal at time period T36. That is, the signal produced by tunnel diode 22 of the phase A circuit becomes a low-level signal at time period T33 due to the Reset A signal supplied by source 24. The next Set B signal supplied by source 42 occurs at time period T36, and, in view of the relative reverse-biased (high impedance) condition of backward diode 34, causes an induced current signal to be produced in winding 38. This induced current signal creates current flow from ground via backward diode 52 and through tunnel diode 44 whereby the tunnel diode is switched to its high-voltage operating condition. Thus, a high level output signal is produced at time period T36. The high level signal continues until a Reset B signal is produced at time period T39.

Again, at time period T40 a Set B signal is produced in coincidence with a low level "input" signal. Therefore, tunnel diode 44 switches to the high voltage operating condition thereby producing a high level output signal. This signal continues until tunnel diode 44 is reset to the low-voltage operating condition at time period T43 by a Reset B signal from source 46. This operation is similar to that previously described.

The final Set B signal is presented at time period T44 in coincidence with a high level "input" signal. As described before, this set of conditions will not cause a change in the tunnel diode conditions to the high-voltage operation since backward diode 34 acts as a low impedance shunt across winding 38. Therefore, a low-level output signal is produced.

In the foregoing description, it has been shown that an output signal (high-level) is produced only when no input signal (low-level) is applied, and vice versa. This is typical NOR logic operation. The tunnel diode is the switching element in the circuit and the one backward diode is, effectively, the control element. These are important concepts involved in the invention. However, modifications and alterations may be made. Thus, for example, isolation diodes 56 and 58 may be eliminated under certain conditions and/or backward diodes 30 and 52 may be replaced by regular high speed switching diodes. Furthermore, capacitors 14 and 36 may be eliminated in cases where a very high repetition rate of operation is used or if the inductance of windings 16 and 38 is high. Moreover, it should be clear that the suggested timing may be altered and the signal polarities changed if needed or desired provided commensurate changes are made in the circuit configuration. Of course, the signals are arbitrary and the high level signal may be any potential value, as may the low level signal, so long as the relative levels exist. These changes are contemplated to be within the scope of this description so long as the inventive concepts are utilized.

The embodiments of the invention in which an exclusive property or privilege is claimed are defined as follows:

1. A logic circuit comprising,
input means for supplying input signals having two different levels,
transformer means,
a first winding of said transformer means serially connected to said input means,
control means for supplying control signals having two different levels,
a second winding of said transformer means serially connected to said control means,
said control means adapted to selectively provide signals to said second winding,
variable impedance means connected across said first winding of said transformer thereby to control the impedance of said first winding,
said variable impedance means adapted to selectively short circuit said first winding in response to one level of said input signal whereby no effective signal is induced in said first winding by a control signal in said second winding,
bistable tunnel diode means,
a first element of said bistable means serially connected to said first transformer winding,
bias means serially connected to a second element of said bistable means, current source means connected to said second element of said bistable means such that current is supplied to said bistable means in response to the concurrent application of a control signal and an input signal of the second level,
and output means connected to said second element of said bistable means.

2. In combination,
a tunnel diode,
bias means connected to a first electrode of said tunnel diode,
said bias means adapted to cause said tunnel diode to operate in a bistable mode and to normally be in one stable state,
transformer means having a first winding connected to a second electrode of said tunnel diode,
control source means connected to a second winding of said transformer means for selectively supplying signals thereto,
unidirectional conducting means connected across said first transformer winding,
input means connected to said transformer and said unidirectional conducting means and adapted to supply different level signals thereto such that said unidirectional conducting means selectively provides a short-circuit or an open-circuit shunt path in parallel with said first winding whereby the impedance thereof varies relative to said second winding,
said signals selectively supplied to said second winding by said control source means being effective to induce signals in said first winding in accordance with the impedance of said first winding, and current supplying means connected to said first electrode of said tunnel diode to supply current to said tunnel diode only when said control source means supplies a signal to said second winding and when said unidirectional conducting means coincidentally provides an open circuit path in parallel with said first winding, said current supplied to said tunnel diode being sufficient to switch said tunnel diode to another stable state.

3. A logic system comprising, a plurality of cascaded logic stages, each stage comprising
a tunnel diode,
bias means connected to a first electrode of said tunnel diode,
said bias means adapted to cause said tunnel diode to operate in a bistable mode and to normally be in one stable state,
transformer means having a first winding connected to a second electrode of said tunnel diode,
control source means connected to a second winding of said transformer means for selectively supplying control signals thereto,
unidirectional conducting means exhibiting little or no charge storing characteristics connected across said first transformer winding,
input means connected to said transformer and said unidirectional conducting means and adapted to supply different signals thereto such that said unidirectional conducting means selectively provides a short-circuit or an open-circuit shunt path in parallel with said first winding whereby the impedance thereof varies relative to said second winding,
said control signals selectively supplied to said second winding being effective to induce signals in said first winding in accordance with the impedance of said first winding,
current supplying means connected to said first electrode of said tunnel diode to supply current to said tunnel diode only when said control source means supplies a signal to said second winding and when said unidirectional conducting means coincidentally provides a circuit path in parallel with said first winding, said current supplied to said tunnel diode being sufficient to switch said tunnel diode to another stable state, output means connected to said first electrode to detect the operating state of said tunnel diode which may be switched to another stable state by a signal induced in said first winding, and resistor means connected between the input and output means of cascaded logic stages to provide the interstage coupling therebetween.

4. In combination, a tunnel diode, bias means connected to a first electrode of said tunnel diode, said bias means adapted to cause said tunnel diode to operate in a bistable mode and to normally be in one stable state, transformer means having a first winding connected in series with a second electrode of said tunnel diode, control source means connected to a second winding of said transformer means for selectively supplying control signals thereto, said first and second windings being inductively coupled, rectifier diode means connected in parallel with said first transformer winding, input means connected to a common junction between said transformer and said diode means and for supplying different magnitude signals thereto such that said diode means selectively provides a relatively low impedance or a relatively high impedance shunt path in parallel with said first winding whereby the impedance thereof varies relative to said second winding, said control signals selectively supplied to said second winding being effective to induce signals in said first winding only when the impedance of said diode means in parallel with said first winding is relatively high, and output means connected to said first electrode to detect the operating state of said tunnel diode which may be switched from said one stable state to another stable state by a signal being induced in said first winding from said second winding.

5. In combination, a tunnel diode, bias means connected to a first electrode of said tunnel diode, said bias means adapted to cause said tunnel diode to operate in a bistable mode and to normally be in one stable state, transformer means having a first winding connected in series with a second electrode of said tunnel diode, first control source means connected to a second winding of said transformer means for selectively supplying first control signals thereto, said first and second windings being inductively coupled, first diode means connected in parallel with said first transformer winding, input means connected to a common junction between said transformer and said first diode means and for supplying different magnitude signals thereto such that said first diode means selectively provides a relatively low impedance or a relatively high impedance shunt path in parallel with said first winding whereby the impedance thereof varies relative to said second winding, said first control signals selectively supplied to said second winding being effective to induce signals in said first winding only when the impedance of said first diode means in parallel with said first winding is relatively high, output means connected to said first electrode to detect the operating state of said tunnel diode which may be switched from said one stable state to another stable state by a signal being induced in said first winding from said second winding, second diode means connected to said first electrode of said tunnel diode, and second control source means connected to said second diode means for selectively supplying second control signals thereto, said second control signals being supplied at times different from said first control signals and having the sense and magnitude to switch said tunnel diode from said another stable state to said one stable state.

6. In combination, a tunnnel diode, bias means connected to a first electrode of said tunnel diode, said bias means adapted to cause said tunnel diode to operate in a bistable mode and to normally be in one stable state, transformer means having a first winding connected to a second electrode of said tunnel diode, control source means connected to a second winding of said transformer means for selectively supplying control signals thereto, non-linear impedance means connected in parallel with said first transformer winding, input means connected to said transformer and said non-linear impedance means and adapted to supply different level signals thereto such that said non-linear means selectively provides a small or large impedance path in parallel with said first winding whereby the impedance thereof varies, said control signals selectively supplied to said second winding being effective to induce signals in said first winding in accordance with the impedance of said first winding and thereby change the operating state of said tunnel diode, further diode means connected to said first electrode of said tunnel diode, and reference potential means connected thereto, said further diode providing a low impedance current path when said tunnel diode is switched from said one stable state to said another stable state.

References Cited by the Examiner

UNITED STATES PATENTS

| | | | |
|---|---|---|---|
| 2,483,450 | 10/1949 | Wolfner | 328—1 |
| 2,782,404 | 2/1957 | Bergman | 307—88.5 |
| 2,966,599 | 12/1960 | Haas | 307—88.5 |
| 3,089,961 | 5/1963 | Overn et al. | 307—88.5 |
| 3,096,449 | 7/1963 | Stucki | 307—88.5 |
| 3,122,608 | 2/1964 | Taylor | 307—88.5 |

OTHER REFERENCES

Publication I: Solid State Ckts Conf. Dig. of Tech. Paper, "Application of Tunnel Diodes," by Lewen et al., February 10, 1960, pages 10 and 11.

Publication II: Industrial Electronics, "Duality and Tunnel Diodes," by Langlois, February 1963, pages 285–288.

ARTHUR GAUSS, *Primary Examiner.*

B. P. DAVIS, *Assistant Examiner.*